US 6,229,184 B1

(12) United States Patent
Riccobene

(10) Patent No.: US 6,229,184 B1
(45) Date of Patent: May 8, 2001

(54) SEMICONDUCTOR DEVICE WITH A MODULATED GATE OXIDE THICKNESS

(75) Inventor: Concetta Riccobene, Mountain View, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/250,174

(22) Filed: Feb. 16, 1999

(51) Int. Cl.[7] .......................... H01L 29/76; H01L 21/336
(52) U.S. Cl. ..................... 257/368; 257/410; 257/411; 438/257; 438/299; 438/766
(58) Field of Search .................... 257/368, 410, 257/411; 438/275, 299, 520, 766, 981

(56) References Cited

U.S. PATENT DOCUMENTS 5,949,117 * 9/1999 Sandhu et al. ........................ 257/410
6,077,749 * 6/2000 Gardner et al. ...................... 438/299

* cited by examiner

Primary Examiner—Matthew Smith
Assistant Examiner—Igwe U. Anya

(57) ABSTRACT

High drain capacitance is reduced, thereby increasing device speed, by forming transistors with a gate oxide having a thickness which is smaller at the drain region than at the source region. Embodiments include selectively ion implanting neutral impurities, such as silicon, geranium or argon, into and/or roughening the substrate surface to increase its oxidation rate proximate the contemplated source region and/or selectively ion implanting nitrogen to reduce its oxidation rate proximate the contemplated drain region. Other embodiments include etching a gate oxide layer having a first thickness to form a portion having a reduced second thickness proximate the contemplated drain region and thermally oxidizing to form a transition zone having a thickness gradually decreasing from the first thickness to the second thickness.

20 Claims, 5 Drawing Sheets

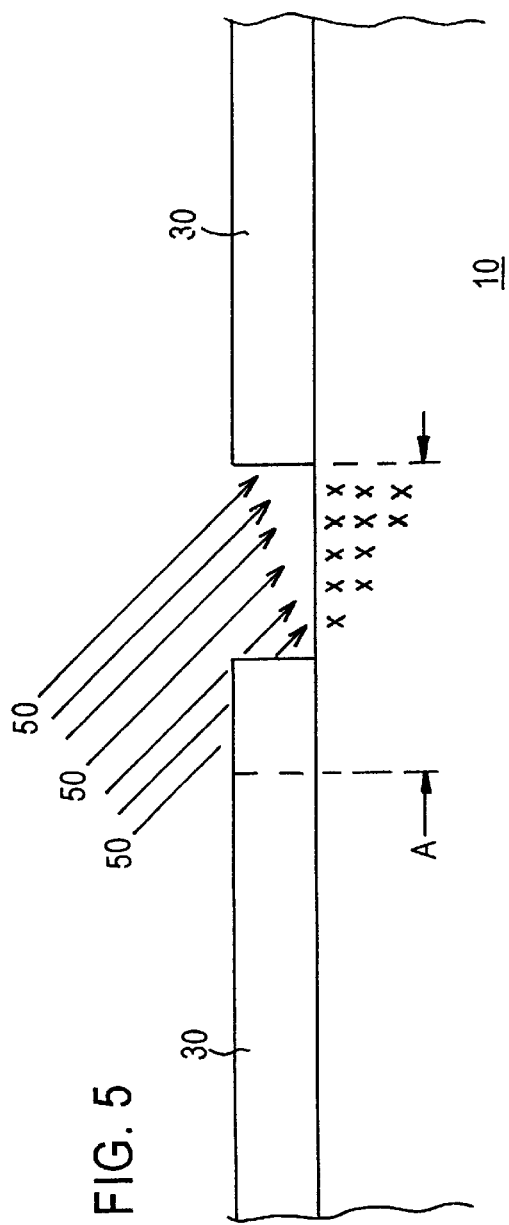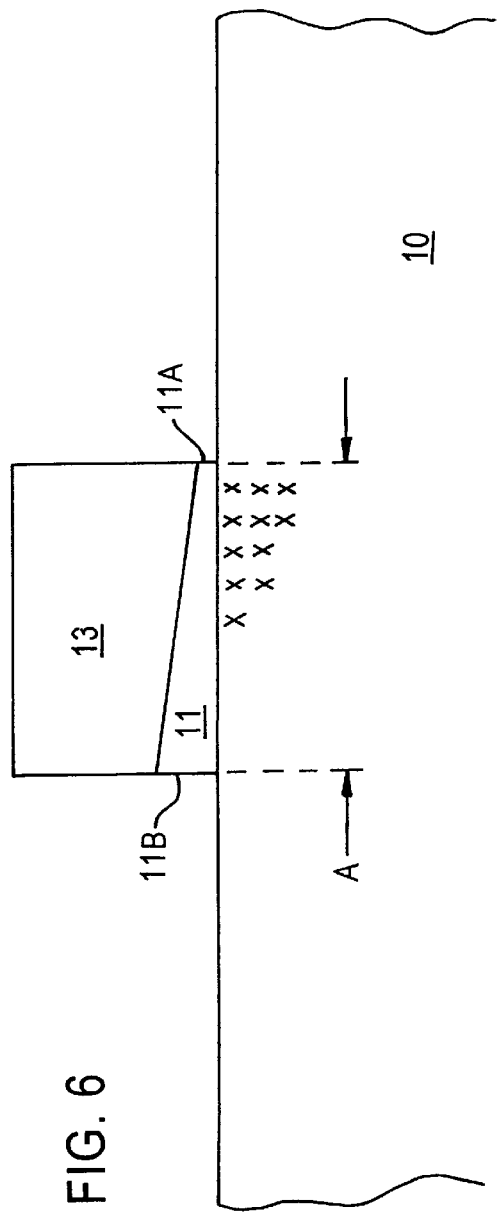

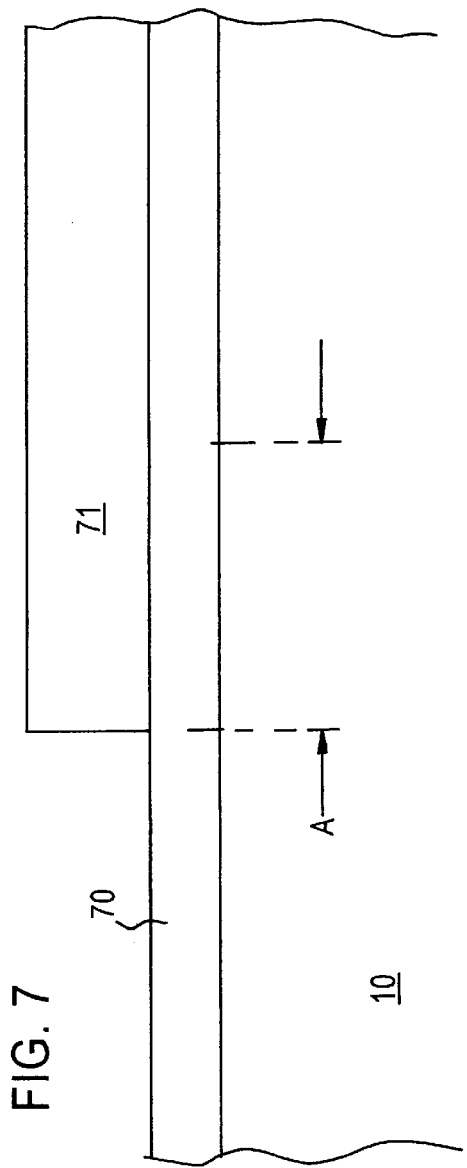
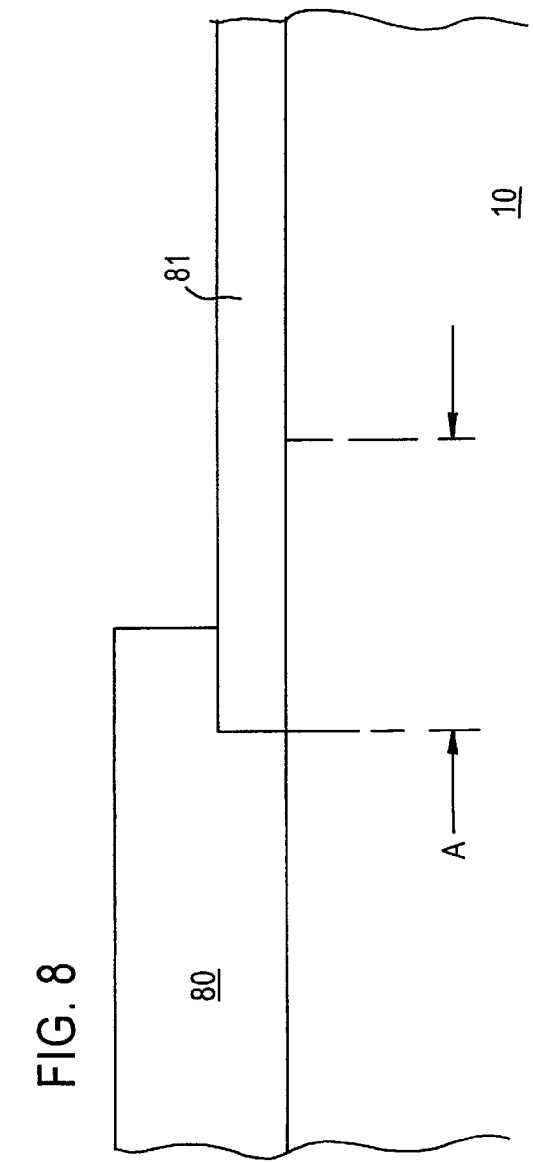

SEMICONDUCTOR DEVICE WITH A MODULATED GATE OXIDE THICKNESS

TECHNICAL FIELD

The present invention relates to a semiconductor device suitable for high speed performance. The present invention is particularly applicable for ultra large scale integration semiconductor devices having a design rule of abut 0.18 micron and under.

1. Background Art

The escalating requirements for high density and performance associated with ultra large scale integration semiconductor devices have been found difficult to satisfy in terms of providing a low RC (resistance capacitance) interconnection pattern. High performance microprocessor applications require rapid speed of semiconductor circuitry. The speed of semiconductor circuitry various inversely with the resistance and capacitance of the interconnection pattern. As design rules are reduced to about 0.18 micron and below, e.g., about 0.15 micron and below, the rejection rate due to integrated circuit speed delays severely limits production throughput and significantly increases manufacturing costs.

Conventional integrated circuits are limited in speed by a high capacitance load. When the high capacitance load becomes apparent in the "OFF" state, it is a clear indication that the source and drain capacitance significantly contribute to the total capacitance. Of the two, source capacitance and drain capacitance, the latter is the one that will mostly limit the circuit speed in the "ON" state. Therefore, it is highly desirable to limit the value of the drain capacitance.

There is, therefore, a need for a semiconductor device and enabling methodology wherein the gate oxide thickness is reduced to enable reduction of the drain capacitance without creating reliability problems.

2. Disclosure of the Invention

An advantage of the present invention is a semiconductor device comprising a transistor exhibiting reduced drain capacitance and a gate oxide layer with high reliability.

Another advantage of the present invention is a method of manufacturing a semiconductor device comprising a transistor with reduced drain capacitance and a gate oxide layer with high integrity.

Additional advantages and other features of the present invention will be set forth in the description which follows and in part will be apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a semiconductor device containing a transistor, the transistor comprising: a gate dielectric layer having first and second side surfaces on a substrate with a channel region therebetween; source and drain regions in the substrate with the channel region therebetween, the drain region formed proximate the first side surface and the source region formed proximate the second side surface; and a gate electrode on the gate dielectric layer, wherein the gate dielectric layer has a thickness at the first side surface which is less than its thickness at the second side surface.

Another aspect of the present invention is a method of manufacturing a semiconductor device, the method comprising: forming a gate dielectric layer on a substrate surface, the gate dielectric layer having first and second side surfaces and a thickness at the first side surface which is less than its thickness at the second side surface; forming a gate electrode layer on the gate dielectric layer; and forming source and drain regions in the semiconductor substrate with a channel region therebetween underlying the gate dielectric layer, the drain region formed proximate the first side surface and the source region formed proximate the second side surface.

Embodiments of the present invention include a semiconductor device comprising a transistor with a gate oxide layer having a thickness which gradually increases from proximate the drain region to proximate the source region, and a gate oxide having a first uniform thickness and a second uniform thickness greater than the first uniform thickness with a gradually increasing the transition zone between the first thickness and the second thickness. Embodiments of the present invention also include thermally oxidizing a substrate surface to form a gate oxide layer having a modulated thickness by ion implanting neutral impurities, such as silicon, argon or germanium, to increase the substrate surface oxidation rate proximate the contemplated source region and/or ion implanting nitrogen into the substrate surface to reduce the oxidation rate proximate the contemplated drain region.

Additional advantages of the present invention will become readily apparent to those skilled in this art from the following detailed description, wherein embodiments of the present invention are described, simply by way of illustration of the best mode contemplated for carrying out the present invention. As will be realized, the present invention is capable of other and different embodiments, and its several details are capable of modifications in various obvious respects, all without departing from the present invention. Accordingly, the drawings and description are to be regarded as illustrative in nature, and not as restrictive.

BRIEF DESCRIPTION OF DRAWINGS

FIGS. 5 and 6 represent sequential phases of a method in accordance with another embodiment of the present invention.

FIGS. 7, 8, 9 and 10 represent sequential phases of a method in accordance with further embodiment of the present invention.

In FIGS. 1–10, like reference numerals denote similar features.

DESCRIPTION OF THE INVENTION

Figure 1:
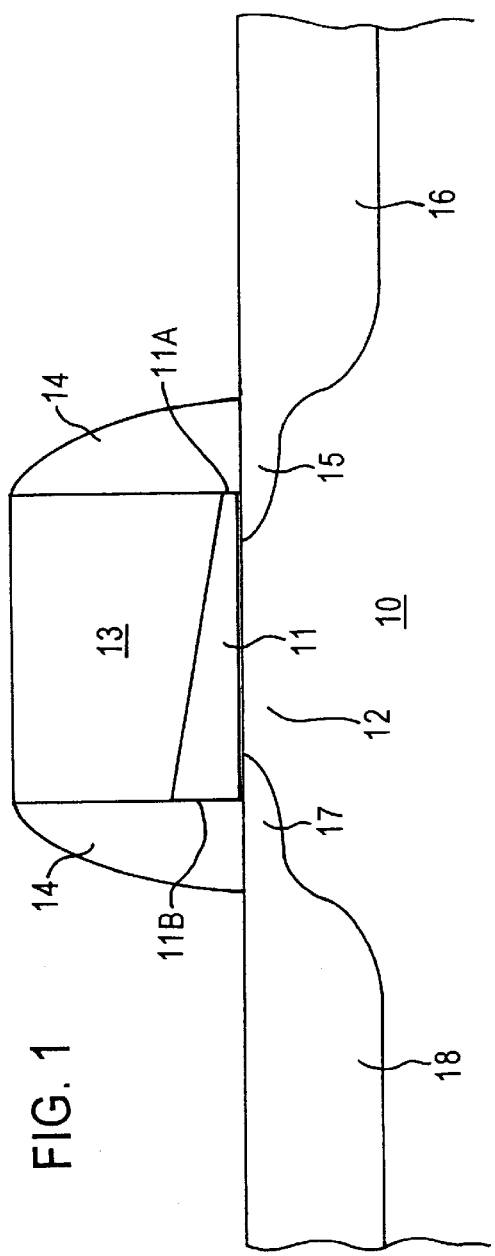
FIG. 1 schematically illustrates a transistor comprising a modulated gate oxide thickness in accordance with an embodiment of the present invention.

The present invention addresses and solves problems attendant upon attempting to satisfy the speed requirements for semiconductor circuitry as feature sizes are reduced into the deep sub-micron ranges to satisfy the increasing demands for miniaturization. Thus, the present invention enjoys particular industrial applicability in manufacturing semiconductor devices having a design rule of about 0.18 micron and under, e.g., about 0.15 micron and under. The present invention advantageously reduces drain capacitance without creating reliability problems attendant upon reduction of the gate dielectric layer thickness.

The present invention achieves the foregoing objectives by strategically decoupling the thickness of the gate dielectric layer proximate the drain region from the thickness of the gate dielectric layer proximate the source region. Thus, the present invention provides a gate dielectric layer with a modulated thickness strategically optimized in proximity to the drain region for reducing the drain capacitance thereby increasing circuit speed. At the same time, the thickness of the gate oxide layer is optimized proximate the source region for improved mechanical stress and reduced hot carrier injection, and furthermore decreasing the leakage current in the "OFF" state.

In accordance with embodiments of the present invention, a transistor is formed with a gate dielectric layer having a thickness proximate the drain region which is less than the gate dielectric layer thickness proximate the source region. Advantageously, the gate dielectric layer is formed without any step region, thereby avoiding an abrupt change or spike in the electric field. Embodiments of the present invention include forming a gate dielectric layer having a thickness which gradually increases from proximate the drain region to proximate the source region. Other embodiments of the present invention include forming a gate oxide layer having a first portion with a substantially uniform first thickness proximate the drain region, a second portion with a substantially uniform second thickness, greater than the first thickness, proximate the source region, and a transition zone between the first and second portions which gradually increases in thickness from the first portion to the second portion.

The optimum thickness of the gate dielectric layer at the drain region and at the source region can be readily determined in a particular situation. For example, it was found suitable to form the gate dielectric layer with a thickness proximate the source region which exceeds the thickness proximate the drain region by about 10 Å to about 20 Å. Embodiments of the present invention comprise forming a gate dielectric layer having a thickness proximate the drain region of about 15 Å to about 25 Å and a thickness proximate the source region of about 25 Å to about 35 Å. Embodiments of the present invention further comprise forming a gate dielectric layer having a first portion of a substantially uniform first thickness of about 15 Å to about 25 Å proximate the drain region, a second portion of substantially uniform second thickness greater than the first thickness, i.e. about 25 Å to about 35 Å, proximate the source region, and a transition zone therebetween increasing in thickness from the first portion to the second portion.

After forming the gate dielectric layer in accordance with the present invention, conventional practices are implemented in depositing a gate electrode layer, e.g. doped polycrystalline silicon, and patterning to form a gate electrode layer with the gate dielectric layer thereunder having the modulated thickness. Shallow source and drain extension implants are then formed with the shallow drain extension implant proximate the first side surface of the gate dielectric layer having the reduced thickness. Dielectric sidewall spacers are then formed and ion implantation conducted to form the moderate or heavily doped implants which, after subsequent conventional annealing, form source and drain regions with shallow extensions.

The gate dielectric layer of the present invention can comprise any conventional gate dielectric material employed for a gate dielectric layer in manufacturing semiconductor devices, e.g. silicon oxide or silicon oxynitride. Advantageously, the gate dielectric layer can be formed of silicon oxide by thermal oxidation.

Embodiments of the present invention comprise strategically altering the substrate surface to obtain a differential oxidation rate, thereby enabling forming the gate oxide layer with a modulated thickness. For example, a neutral impurity, such as silicon, germanium or argon, is implanted into a selected portion of the substrate surface to increase the oxidation rate in the implanted region. The techniques disclosed in co-pending Application Ser. No. 08/569,704 filed on Dec. 8, 1995 now U.S. Pat. No. 5,869,385, issued Feb. 9, 1999 can be employed. The entire disclosure of co-pending Application Ser. No. 08/569,704 now U.S. Pat. No. 5,869,385 is incorporated herein by reference.

In another embodiment of the present invention, the oxidation rate of a selected portion of the substrate is reduced, as by ion implanting nitrogen, thereby enabling formation of the gate oxide layer having a modulated thickness by thermal oxidation. In a further embodiment of the present invention, the oxidation rate of the substrate surface is selectively increased proximate the contemplated source region and the oxidation rate selectively reduced by nitrogen implantation proximate the contemplated drain region, in either order, prior to thermal oxidation.

Other embodiments of the present invention comprise forming a gate oxide layer at a first thickness, selectively etching a portion of the gate oxide layer by reducing its thickness to a second thickness proximate the contemplated drain region and then thermally oxidizing, with the use of masks, to form a transition zone gradually decreasing from the first thickness to the second thicknesses, thereby avoiding abrupt stepped portions.

An embodiment of the present invention is schematically illustrated in FIG. 1 and comprises substrate 10, gate dielectric layer 11 formed on the main surface of substrate 10 with a channel region 12 thereunder. Gate dielectric layer comprises first side surface 11A and second side surface 11B, and has a thickness which gradually increases from the first side surface 11A to the second side surface 11B. Gate electrode 13 is formed on gate dielectric layer 11, and dielectric sidewall spacers 14, e.g., silicon nitride or silicon oxynitride, are formed thereon in a conventional manner. Drain region, comprising shallow extension 15 and a moderately or heavily doped region 16, is formed proximate the first side surface 11A of gate dielectric layer 11 having a reduced thickness, while source region, shallow source extension 17 and moderately or heavily region 18, is formed proximate the second side surface 11B of gate dielectric layer 11.

Figure 2:
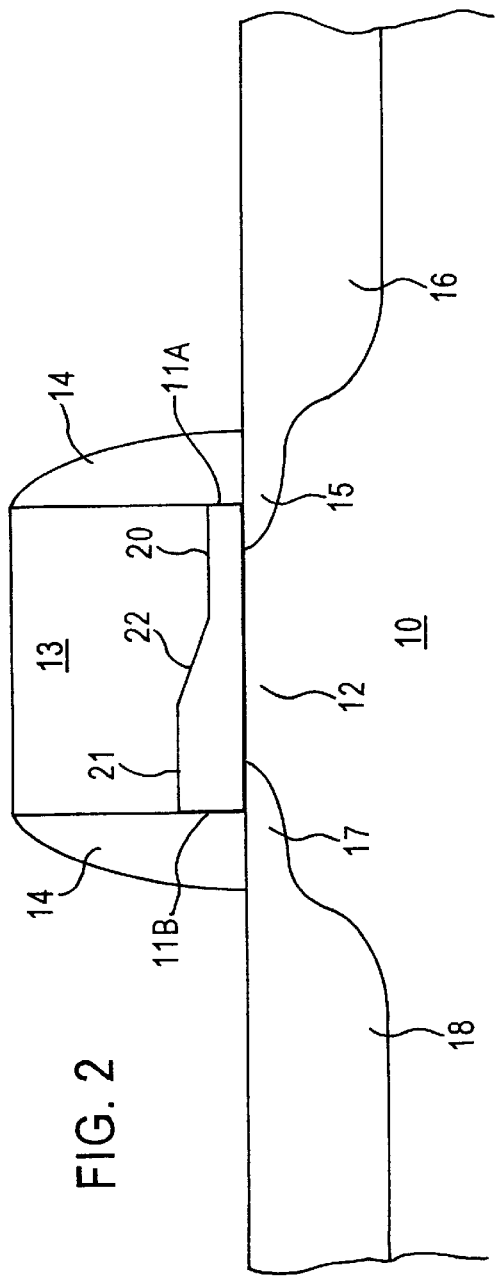
FIG. 2. Schematically illustrates a transistor comprising a modulated gate oxide thickness in accordance with another embodiment of the present invention.

Another embodiment of the present invention is shown in FIG. 2 wherein features similar to those of FIG. 1 are denoted by similar reference numerals. The embodiment schematically illustrated in FIG. 2 comprises a gate dielectric layer having a first portion 20 having a substantially uniform first thickness, a second portion 21 having a substantially uniform second thickness greater than the first thickness, and a transition zone 22 which gradually increases in thickness from the first portion 20 to the second portion 21, thereby avoiding an abrupt stepped feature and consequential spike in the electric field.

Figure 3:
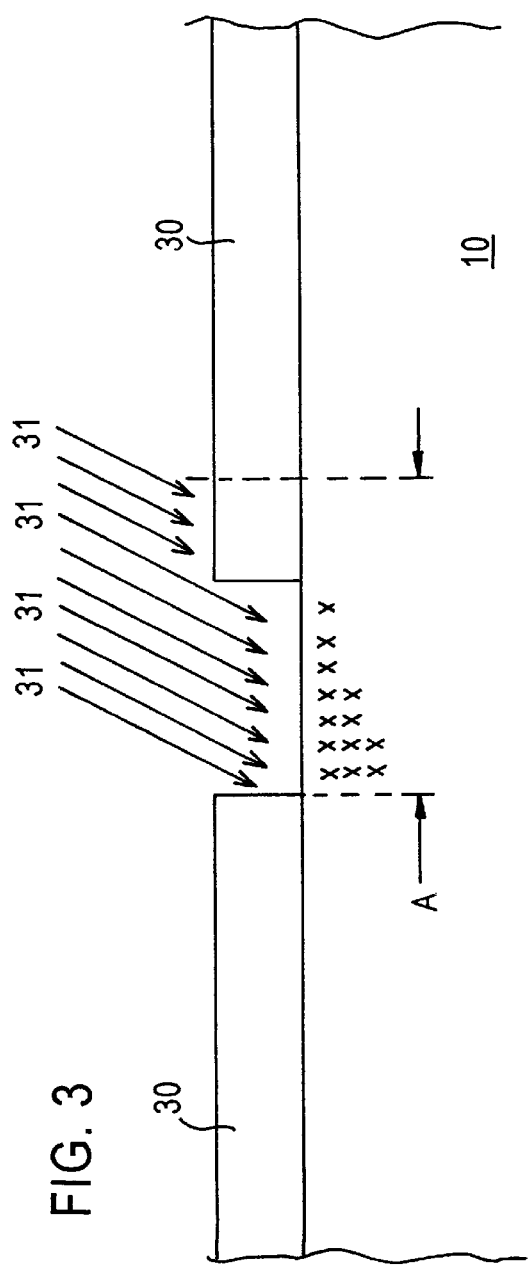
FIGS. 3 and 4 represent sequential phases of a method in accordance with an embodiment of the present invention.
Figure 4:
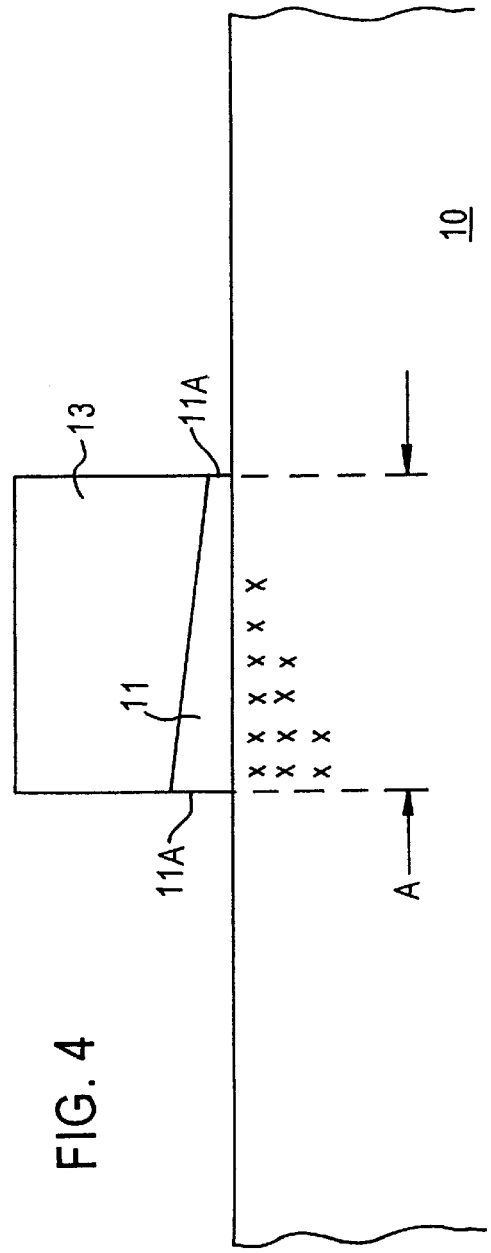

FIGS. 3 and 4 schematically illustrate sequential phases of methodology in accordance with an embodiment of the present invention. As shown in FIG. 3, a photoresist mask 30 is formed on the main surface of substrate 10. Region A denotes the contemplated channel region which is to underlie the gate oxide layer of the transistor. Neutral impurities atoms are then ion implanted, as shown by arrows 31, into a selected portion of the surface of the substrate 10, indicated by "X" marks. By employing angular ion implantation, a gradually increasing concentration of implanted impurity atoms can be obtained progressing toward the contemplated source region. Suitable ions include silicon, germanium and argon, which cause damage to the crystalline structure of the semiconductor substrate thereby increasing its oxidation rate. The photoresist mask 30 is then stripped, a gate electrode layer is deposited, and patterning is conducted to form the gate electrode structure, as shown in FIG. 4, comprising gate electrode 13 overlying gate oxide layer 11 having a gradually increasing thickness in progressing from the first side surface 11A to the second side surface 11B.

In the embodiment depicted in FIGS. 5 and 6, nitrogen atoms are ion implanted, by angular ion implantation indicated by arrows 50, into a selected portion of the main surface of substrate 10. The implanted nitrogen atoms "X" retard oxidation of the selected portion of the substrate. Photoresist mask 30 is then removed, thermal oxidation is conducted, gate electrode layer, e.g., doped polycrystalline silicon, is deposited and patterning is conducted to form the gate electrode structure as depicted in FIG. 6 comprising gate electrode 13 on gate oxide layer 11 having first side surface 11A second side surface 11B, and a thickness which gradually increases from the first side surface 11A to the second side surface 11B.

In implanting silicon, germanium or argon, an implantation dosage of about $1\times10^{12}$ to about $1\times10^{13}$ atoms cm$^{-2}$ at an energy of about 3 to about 5KeV can be employed. In implanting nitrogen atoms to reduce the oxidation rate of the substrate surface, an implantation dosage of about $5\times10^{12}$ to about $5\times10^{13}$ atoms cm$^{-2}$ and an implantation energy of about 3 to about 5 KeV can be employed. Angular ion implantation of the neutral atoms or nitrogen can be implemented at an angle of about 30° to about 45° with respect to the substrate surface.

Figure 9:
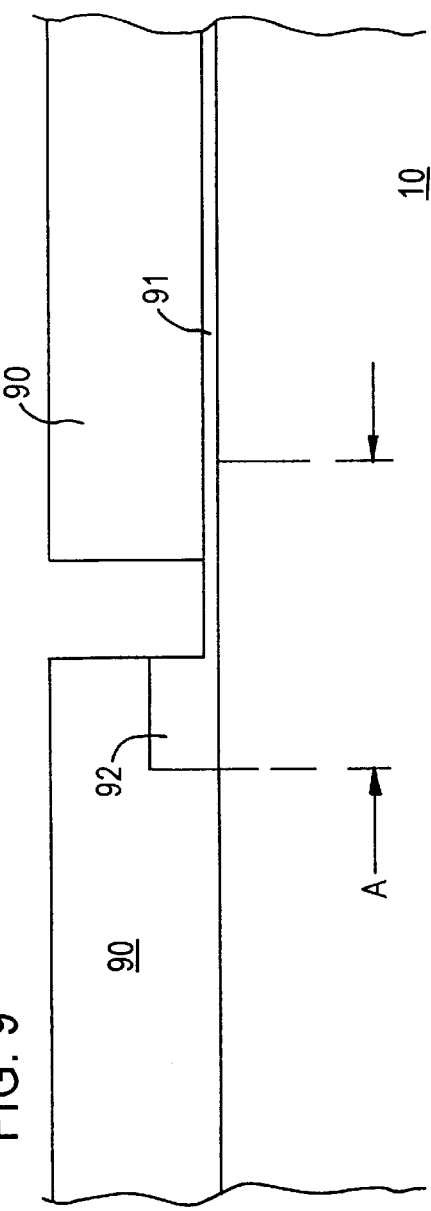
Figure 10:
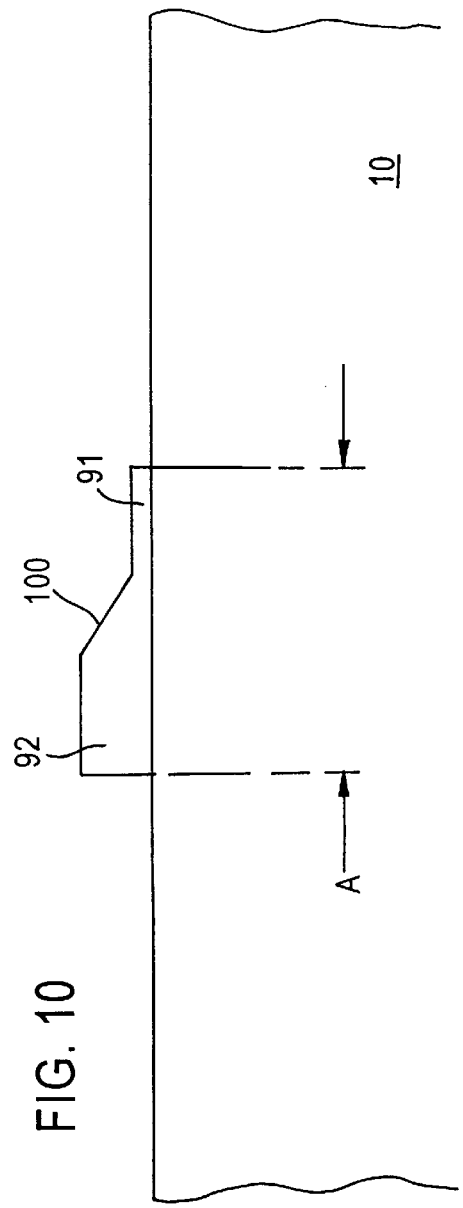

Another embodiment of methodology in accordance with the present invention is schematically illustrated in FIGS. 7–10. Adverting to FIG. 7, the surface of substrate 10 is oxidized in a conventional manner to form a gate oxide layer 70. Region A denotes the contemplated channel region which would underlie the ultimately formed gate oxide layer. A photoresist mask 71 is formed over the contemplated gate oxide layer extending from the contemplated source region toward the contemplated drain region, and etching is conducted to remove the portion of the gate oxide layer 70 extending from the contemplated source region away from the contemplated drain region. As shown in FIG. 8, another photoresist mask 80 is formed overlying a portion of remaining gate oxide layer 81 (FIG. 7), and etching is conducted to reduce the thickness of the exposed portion of the remaining gate oxide layer, thereby leaving a second portion 92 having a thickness greater than the first portion 91, as shown in FIG. 9. A hard mask 90 is then formed exposing a region adjoining the step between the first portion 91 and second portion 92. Thermal oxidation is then conducted to form a transition zone 100, as shown in FIG. 10, which gradually increases from the first portion 91 of the gate oxide layer to the second portion 92, thereby forming a gate oxide structure having a modulated thickness similar to that shown in FIG. 2.

The present invention advantageously enables manufacturing a semiconductor device comprising a transistor with a gate dielectric layer having a differential thickness, wherein the thickness proximate the drain region is optimized independently of the thickness proximate the source region, thereby reducing the drain capacitance without adversely impacting the structural integrity of the gate dielectric layer or creating reliability problems. The present invention enjoys applicability in the manufacture of various types of semiconductor devices, and is particularly applicable in manufacturing semiconductor devices having submicron design rules, e.g, a design rule of about 0.18 microns and under, such as about 0.15 micron and under.

In the previous description, numerous specific details are set forth, such as specific materials, structures, chemicals, processes, etc., to provide a better understanding of the present invention. However, the present invention can be practiced without resulting to the details specifically set forth. In other instances, well known processing and materials have not been described in detail in order not to unnecessarily obscure the present invention.

Only the preferred embodiment of the present invention and but a few examples of its versatility are shown and described in the present disclosure. It is to be understood that the present invention is capable of use in various other combinations and environments and is capable is changes or modifications within the scope of the inventive concept as expressed herein.

What is claimed is:

1. A semiconductor device containing a transistor, the transistor comprising:
    a gate dielectric layer having first and second side surfaces on a substrate with a channel region therebetween:
    source and drain regions in the substrate with the channel region therebetween the drain region formed proximate the first side surface and the source region formed proximate the second side surface, wherein the gate dielectric layer has a thickness at the first side surface which is less than its thickness at the second side surface; and
    a gate electrode on the gate dielectric layer, wherein the thickness of the gate dielectric layer continuously and gradually increases from the first side surface to the second side surface.

2. The semiconductor device according to claim 1, wherein the substrate comprises silicon and the gate dielectric layer comprises silicon oxide.

3. The semiconductor device according to claim 2, wherein the gate dielectric layer has a thickness at the second side surface which exceeds the thickness of the gate dialectic layer at the first side surface by about 10 Å to about 20 Å.

4. The semiconductor device according to claim 3, wherein the gate dielectric layer thickness at the first side surface is about 15 Å to about 25 Å, and the gate dielectric layer thickness at the second side surface is about 25 Å to about 35 Å.

5. The semiconductor device according to claim 1, wherein each of the source and drain regions comprises a shallow extension.

6. A semiconductor device containing a transistor, the transistor comprising:
    a gate dielectric layer having first and second side surfaces on a substrate with a channel region therebetween:
    source and drain regions in the substrate with the channel region therebetween the drain region formed proximate the first side surface and the source region formed proximate the second side surface, wherein the gate dielectric layer has a thickness at the first side surface which is less than its thickness at the second side surface; and a gate electrode on the gate dielectric layer, wherein the gate dielectric layer comprises:
  a first portion having a substantially uniform first thickness extending from the first side surface;
  a second portion having a substantially uniform second thickness, greater than the first thickness, extending from the second side surface; and
  a third portion between the first and second portions, the third portion having a thickness which continuously and gradually increases from the first portion to the second portion.

7. The semiconductor device according to claim 6, wherein the substrate comprises silicon and the gate dielectric layer comprises silicon oxide.

8. The semiconductor device according to claim 6, wherein the second thickness exceeds the first thickness by about 10 Å to about 20 Å.

9. The semiconductor device according to claim 8, wherein:
  the first thickness is about 15 Å to about 25 Å; and
  the second thickness is about 25 Å to about 35 Å.

10. A method of manufacturing a semiconductor device, the method comprising:
  selectively ion implanting a neutral impurity into and/or roughening a portion of a substrate surface to increase its oxidation rate, the substrate comprising silicon;
  thermally oxidizing the substrate surface to form a gate oxide layer on the substrate surface, the gate oxide layer having first and second side surfaces and a thickness at the first side surface which is less than its thickness at the second side surface the second side surface overlying the portion of the substrate with the increased oxidation rate;
  forming a gate electrode layer on the gate oxide layer; and
  forming source and drain regions in the semiconductor substrate with a channel region therebetween underlying the gate oxide layer, the drain region formed proximate the first side surface and the source region formed proximate the second side surface.

11. The method according to claim 10, comprising implanting silicon, germanium or argon as the neutral impurity to increase the substrate surface oxidation rate.

12. The method according to claim 10, further comprising selectively ion implanting nitrogen into a portion of the substrate proximate the contemplated drain region to reduce the oxidation rate of the substrate before thermally oxidizing the substrate.

13. A method of manufacturing a semiconductor device, the method comprising:
  thermally oxidizing a substrate surface to form a gate oxide layer having a first thickness, the substrate comprising silicon;
  etching to reduce a first portion of the gate oxide layer to a substantially uniform second thickness leaving a second portion having the substantially uniform first thickness with a step between the first and second portion;
  thermally oxidizing to form a transition zone between the first and second portions, the transition zone continuously and gradually increasing in thickness from the first portion to the second portion;
  forming a gate electrode layer on the gate dielectric layer; and
  forming source and drain regions in the semiconductor substrate with a channel region therebetween underlying the gate dielectric layer, the drain region formed proximate the first side surface and the source region formed proximate the second side surface.

14. The method according to claim 13, wherein the first thickness exceeds the second thickness by about 10 Å to about 20 Å.

15. The method according to claim 14, wherein the first thickness is about 15 Å to about 25 Å and the second thickness is about 25 Å to about 35 Å.

16. A method of manufacturing a semiconductor device, the method comprising:
  forming a gate dielectric layer on a substrate surface, the gate dielectric layer having first and second side surfaces and a thickness at the first side surface which is less than its thickness at the second side surface;
  forming a gate electrode layer on the gate dielectric layer; and forming source and drain regions in the semiconductor substrate with a channel region therebetween underlying the gate dielectric layer, the drain region formed proximate the first side surface and the source region formed proximate the second side surface, wherein the thickness of the gate dielectric layer continuously and gradually increases from the first side surface to the second side surface.

17. The method according to claim 16, wherein substrate comprises silicon and the gate dielectric layer comprises silicon oxide;
  the method comprising thermally oxidizing the substrate to form the gate dielectric layer comprising silicon oxide.

18. The method according to claim 17, wherein each of the source and drain regions comprises a shallow extension.

19. The method according to claim 16, comprising selectively ion implanting nitrogen into a portion of the substrate surface to reduce its oxidation rate; and
  thermally oxidizing the substrate surface to form a gate oxide layer having the first side surface overlying the portion of the substrate with the reduced oxidation rate.

20. The method according to claim 16, wherein the gate dielectric layer thickness at the second side surface exceeds the gate dielectric layer thickness of the first side surface by about 10 Å to about 20 Å.

* * * * *